(12) United States Patent
Ghosh et al.

(10) Patent No.: US 9,667,097 B2
(45) Date of Patent: May 30, 2017

(54) SYSTEM AND METHOD FOR MAINTAINING PROPER PHASE NEUTRAL WIRING IN A POWER SYSTEM

(71) Applicant: SCHNEIDER ELECTRIC IT CORPORATION, West Kingston, RI (US)

(72) Inventors: Rajesh Ghosh, Bangalore (IN); Mahima Agrawal, Bangalore (IN); Pradeep Tolakanahalli, Bangalore (IN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 363 days.

(21) Appl. No.: 14/368,679

(22) PCT Filed: Dec. 7, 2012

(86) PCT No.: PCT/US2012/068475
§ 371 (c)(1),
(2) Date: Jun. 25, 2014

(87) PCT Pub. No.: WO2013/101432
PCT Pub. Date: Jul. 4, 2013

(65) Prior Publication Data
US 2014/0333138 A1    Nov. 13, 2014

(30) Foreign Application Priority Data
Dec. 26, 2011 (IN) .......................... 4564/CHE/2011

(51) Int. Cl.
*H02J 7/00*     (2006.01)
*H02J 9/00*     (2006.01)
(Continued)

(52) U.S. Cl.
CPC ............ *H02J 9/061* (2013.01); *G01R 31/024* (2013.01); *G06F 1/30* (2013.01); *H02J 3/46* (2013.01);
(Continued)

(58) Field of Classification Search
CPC .. H02J 9/061; H02J 7/0068; H02J 9/06; H02J 9/062; H02J 7/35; H02J 7/007;
(Continued)

(56) References Cited

U.S. PATENT DOCUMENTS 4,879,624 A * 11/1989 Jones .................... H02H 3/021
307/64
5,602,462 A    2/1997 Stich et al.
(Continued)

FOREIGN PATENT DOCUMENTS

DE     35 40 830 A1    5/1986
DE     102 14 738 A1    10/2003
(Continued)

OTHER PUBLICATIONS

Notification of Transmittal of the International Search Report and the Written Opinion of the International Searching Authority from corresponding PCT/US2012/068475 dated Oct. 1, 2013.

*Primary Examiner* — Jared Fureman
*Assistant Examiner* — Esayas Yeshaw
(74) *Attorney, Agent, or Firm* — Lando & Anastasi, LLP

(57) ABSTRACT

According to one aspect, embodiments of the invention provide a method of operating a UPS system, the method comprising receiving, at an input of a first UPS, input power from a power source, generating, with a first analysis circuit, a first signal indicative of a characteristic of the input power, receiving, at the analysis circuit, a second signal from a second analysis circuit of a device coupled to the power source, the second signal indicative of a characteristic of
(Continued)

input power received at the second analysis circuit, analyzing with the analysis circuitry, the first signal and the second signal, determining, whether an improper wiring condition exists at the input, in response to a determination that an improper wiring condition does not exist, providing output power to an output of the first UPS, and in response to a determination that an improper wiring condition does exist, de-energizing the first UPS.

20 Claims, 7 Drawing Sheets

(51) Int. Cl.
*H02J 9/06* (2006.01)
*G06F 1/30* (2006.01)
*H02J 3/46* (2006.01)
*H02J 13/00* (2006.01)
*G01R 31/02* (2006.01)

(52) U.S. Cl.
CPC .......... *H02J 9/062* (2013.01); *H02J 13/0062* (2013.01); *H02J 2009/063* (2013.01); *Y02B 70/3291* (2013.01); *Y02B 90/222* (2013.01); *Y04S 20/12* (2013.01); *Y04S 20/248* (2013.01); *Y10T 307/625* (2015.04)

(58) Field of Classification Search
CPC .. H02J 3/383; H02J 3/32; H02J 7/0077; H02J 9/00; H02J 1/10; H02J 7/34; H02J 9/04; H02J 1/00; H02J 2009/063; H02J 2009/068; H02J 3/38; H02J 3/387
USPC .......................................................... 307/66
See application file for complete search history.

(56) References Cited

U.S. PATENT DOCUMENTS

| | | | | |
|---|---|---|---|---|
| 5,744,932 | A * | 4/1998 | Kissel | G01R 31/3648 320/106 |
| 6,465,910 | B2 * | 10/2002 | Young | H02J 3/32 307/43 |
| 8,866,345 | B1 * | 10/2014 | Wright | H02H 1/043 307/99 |
| 2007/0064363 | A1 * | 3/2007 | Nielsen | H02J 9/061 361/90 |
| 2008/0167826 | A1 * | 7/2008 | Murry | G01R 31/041 702/58 |
| 2008/0278296 | A1 * | 11/2008 | Noh | H04B 3/54 375/259 |
| 2008/0309166 | A1 * | 12/2008 | Herbener | H02J 9/066 307/64 |
| 2010/0007447 | A1 * | 1/2010 | Mernyk | H02H 11/002 335/7 |
| 2011/0040988 | A1 * | 2/2011 | Wang | G06F 1/266 713/300 |
| 2011/0148202 | A1 * | 6/2011 | Rada | G05F 1/70 307/52 |
| 2013/0069432 | A1 * | 3/2013 | Beg | H02J 9/06 307/64 |

FOREIGN PATENT DOCUMENTS

| | | |
|---|---|---|
| JP | 2001 091600 A | 4/2001 |
| JP | 2004 028773 A | 1/2004 |
| JP | 2005 033923 A | 2/2005 |
| JP | 2008 048576 A | 2/2008 |

* cited by examiner

SYSTEM AND METHOD FOR MAINTAINING PROPER PHASE NEUTRAL WIRING IN A POWER SYSTEM

This application is a U.S. National Stage Application under 35 U.S.C. §371 of International Application No. PCT/US2012/068475, filed Dec. 7, 2012 which claims the benefit of and priority to Indian Application No. 4564/CHE/2011 filed Dec. 26, 2011; the entire disclosure of which is hereby incorporated by reference herein in its entirety.

BACKGROUND OF INVENTION

Field of the Invention

At least one example in accordance with the present invention relates generally to the protection of a parallel UPS system against phase-neutral reversal due to incorrect wiring.

Discussion of Related Art

Uninterruptible Power Supplies (UPS) are commonly used to provide regulated, uninterrupted power for sensitive and/or critical loads. There is an increased desire for UPS systems to provide greater capacity and/or reliability. For example, to provide enhanced scalability and/or redundancy, two UPS's may be electrically connected to form a single parallel UPS system with one output. In such a system, the combination of two UPS's may provide increased power capacity to a load attached to the parallel UPS system. Also, if a first one of the UPS's coupled in parallel fails, the second one of the UPS's coupled in parallel may function as a redundant backup unit for the failed UPS.

SUMMARY OF THE INVENTION

Aspects in accord with the present invention are directed to a method of operating a UPS system having a first UPS, the method comprising receiving, at an input of the first UPS, input power from a power source, generating, with a first analysis circuit within the first UPS, a first signal containing information indicative of a signal characteristic of the input power received by the first UPS, receiving, at the analysis circuit, a second signal from a second analysis circuit of a device coupled to the power source, the second signal containing information indicative of a signal characteristic of input power received at the second analysis circuit, analyzing, with the analysis circuitry, the first signal and the second signal, determining, in response to analyzing, whether an improper wiring condition exists at the input of the first UPS, in response to a determination that an improper wiring condition does not exist at the input, providing output power to an output of the first UPS, and in response to a determination that an improper wiring condition does exist at the input, de-energizing the first UPS.

According to one embodiment, generating a first signal includes monitoring zero-crossing information of the input power received by the first UPS, and generating the first signal containing zero-crossing information of the input power received by the first UPS. In one embodiment, analyzing includes comparing the first signal containing zero-crossing information with the second signal, the second signal containing zero-crossing information of the input power received by the device.

According to another embodiment, generating a first signal includes monitoring polarity information of the input power received by the first UPS, and generating the first signal containing polarity information of the input power received by the first UPS. In one embodiment, analyzing includes comparing the first signal containing polarity information with the second signal, the second signal containing polarity information of the input power received by the device.

According to one embodiment, receiving the second signal includes receiving the second signal from the second analysis circuit via a communication bus coupled between the first UPS and the second analysis circuit. In another embodiment, receiving the second signal further includes receiving the second signal from the device, wherein the device is a second UPS coupled to the power source. In one embodiment, receiving the second signal further includes receiving the second signal from the second analysis circuit, wherein the second analysis circuit is within a PSBP panel coupled to the power source.

According to another embodiment, the method further comprises transmitting the first signal to the second analysis circuit via the communication bus. In another embodiment, de-energizing the first UPS includes de-coupling the first UPS from the power source.

According to one embodiment, the method further comprises detecting, at an output of the first UPS, output power provided to a load, generating, with the analysis circuitry, a third signal containing information indicative of a signal characteristic of the output power detected at the output of the first UPS, receiving, at the analysis circuitry, a fourth signal from a second UPS, the fourth signal containing information indicative of a signal characteristic of output power detected at an output of the second UPS, analyzing, with the analysis circuitry, the third signal and the fourth signal, determining, in response to analyzing, whether an improper wiring condition exists at the output of the first UPS, in response to a determination that an improper wiring condition does not exist at the output, providing output power to the output of the first UPS; and in response to a determination that an improper wiring condition does exist at the output, de-energizing the first UPS.

Another aspect in accord with the present invention is directed to a UPS comprising an input to receive input power from a power source, an output to provide output power to a load, a first analysis circuit coupled to the input and configured to be coupled to a communication bus, and control circuitry coupled to the first analysis circuit, wherein the first analysis circuit is configured to generate a first signal containing information indicative of a signal characteristic of the input power at the input, receive via the communication bus a second signal from a second analysis circuit coupled to the power source, the second signal containing information indicative of a signal characteristic of input power received at the second analysis circuit, analyze the first signal and the second signal, and determine, based on the first and second signal analysis, whether an improper wiring condition exists at the input, wherein, in response to a determination that an improper wiring condition does not exist at the input, the control circuitry is configured to operate the UPS to provide output power to the output, and wherein, in response to a determination that an improper wiring condition does exist at the input, the control circuitry is configured to de-energize the UPS.

According to one embodiment, the UPS further comprises a relay coupled to the input and the control circuitry, wherein in response to a determination by the first analysis circuit that the first and second signals are in phase, the control circuitry is configured to close the relay, allowing that the UPS to provide output power to the output, and wherein, in response to a determination by the first analysis circuit that the first and second signals are out of phase, the control circuitry is configured to open the relay to de-energize the UPS.

According to another embodiment, the first analysis circuit is further coupled to the output and is further configured to generate a third signal containing information indicative of a signal characteristic of the output power at the output, receive via the communication bus a fourth signal from the second analysis circuit, the fourth signal containing information indicative of a signal characteristic of output power at a second UPS containing the second analysis circuit, analyze the third signal and the fourth signal, and determine, based on the third and fourth signal analysis, whether an improper wiring condition exists at the output, wherein, in response to a determination that an improper wiring condition does not exist at the output, the control circuitry is configured to close the relay so that the UPS provides output power to the output, and wherein, in response to a determination that an improper wiring condition does exist at the output, the control circuitry is configured to open the relay to de-energize the UPS.

According to one embodiment, the first analysis circuit comprises a first zero-crossing detector coupled to the input, and a wrong wiring detector coupled to the zero-crossing detector, the control circuitry and the communication bus, wherein the first zero-crossing detector is configured to monitor zero-crossing information of input power received at the input and generate the first signal, the first signal containing zero-crossing information of the input power received at the input, and wherein the wrong wiring detector is configured to compare the first signal containing zero-crossing information with the second signal, the second signal containing zero-crossing information of the input power received by the second analysis circuit.

According to another embodiment, the wrong wiring detector is further configured to receive the second signal containing zero-crossing information from a second zero-crossing detector within a second UPS coupled to the power source. In one embodiment, the wrong wiring detector is further configured to receive the second signal containing zero-crossing information from a second zero-crossing detector within a PSBP coupled to the power source.

According to one embodiment, the first analysis circuit comprises a first DSP coupled to the input, wherein the DSP is configured to monitor polarity information of input power received at the input, generate the first signal containing polarity information of the input power received at the input, and compare the first signal containing polarity information with the second signal, the second signal containing polarity information of the input power received by the second analysis circuit. In another embodiment, the first DSP is further configured to receive the second signal containing polarity information from a second DSP within a second UPS coupled to the power source.

One aspect in accord with the present invention is directed to a parallel UPS system, the system comprising a plurality of UPS's coupled in parallel, each UPS including at least one phase input coupled to a power source via a mains bus, a neutral input coupled to the power source via the mains bus, at least one phase output coupled to a load via a load bus, a neutral output coupled to the load via the load bus, and means for identifying incorrect wiring of the at least one phase input and the neutral input to the mains bus and the at least one phase output and the neutral output to the load bus.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Figure 1:
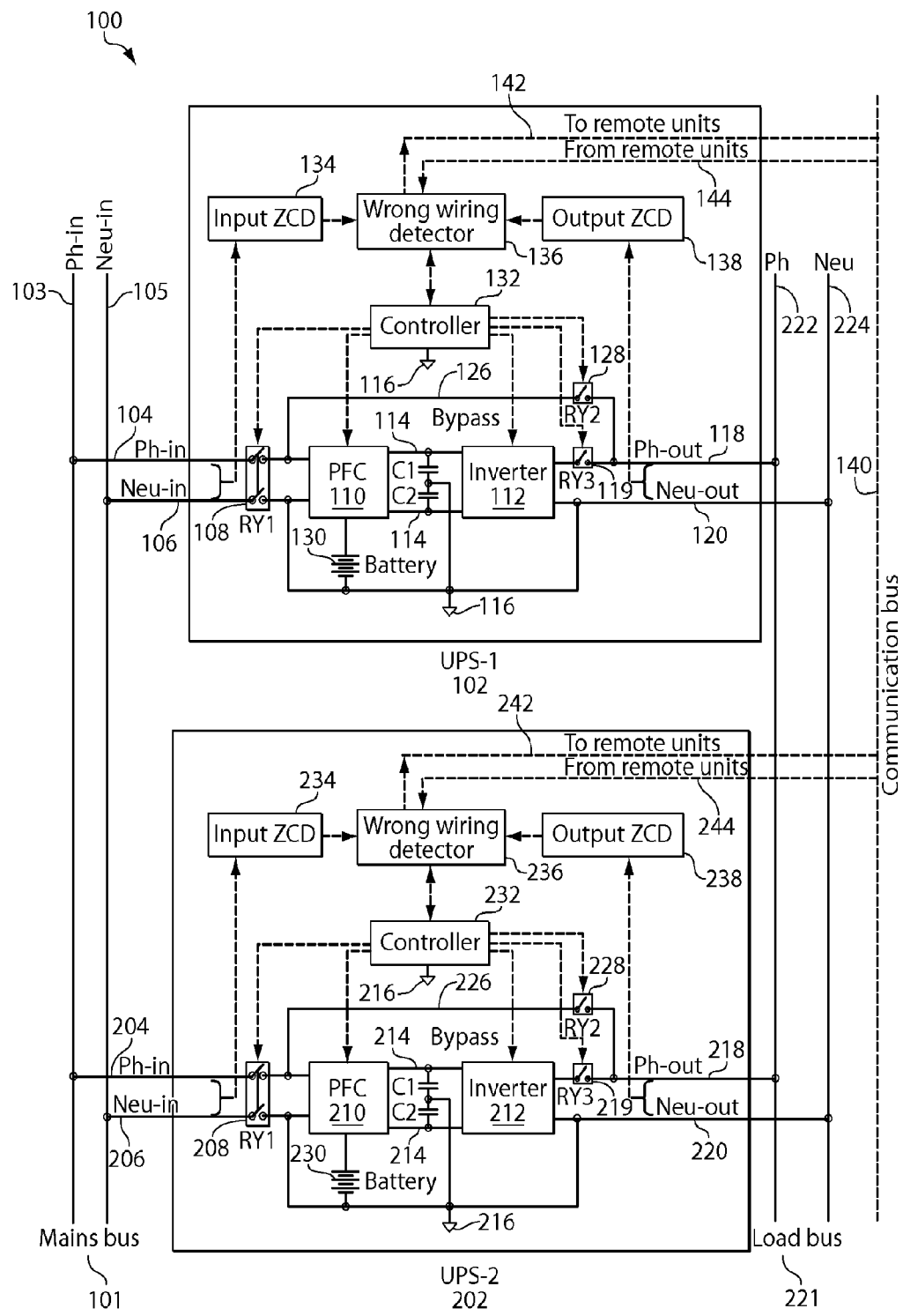
FIG. 1 is a block diagram of a parallel UPS system in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, to provide enhanced scalability and/or redundancy, two UPS's may be electrically connected to form a single parallel UPS system with one output configured to be coupled to a load. In conventional parallel UPS systems, all UPS inputs are connected in parallel to an input mains bus while their outputs are also connected in parallel to feed a common load. According to some embodiments, a Parallel Service Bypass Panel (PSBP) may be used to manage the bypass operation of the entire parallel UPS system in case of UPS maintenance. For example, in such an embodiment, the inputs and outputs of each UPS are routed through the PSBP panel and the PSBP panel is configured to isolate individual UPS units for maintenance.

Typically, the input and output power cable connections to the UPS and/or PSBP are hardwired. As such, there is the possibility that the phase and neutral terminals at the terminal block of any UPS and/or PSBP are reversed due to incorrect wiring. For example, in a parallel UPS system, if an input of a first UPS is coupled to an input phase line and the input of a second UPS is coupled to an input neutral line, there may exist a direct phase to neutral short circuit through the UPS units. Similarly, if an output of a first UPS is coupled to an output phase line and the output of a second UPS is coupled to an output neutral line, the output terminals of each UPS may also be shorted. Incorrect wiring, and any resulting short circuits, may result in the failure of the parallel UPS system or even damage to the parallel UPS system or attached loads.

To protect the parallel UPS system from such short circuits, each UPS is typically fed through a circuit breaker which is configured to trip in the event of a short circuit. However, when the circuit breaker trips, power to the critical load is interrupted. In addition, the short circuit current will pass through each UPS unit before the circuit breaker trips.

At least some embodiments described herein provide a scheme that identifies incorrect wiring in a parallel UPS system prior to a short circuit situation arising, therefore reducing the need to interrupt power to a critical load and preventing the short circuit current from being fed to the UPS units.

FIG. 1 is a circuit diagram of a parallel UPS system 100 in accordance with one aspect of the present invention. The parallel UPS system 100 includes a first UPS 102 and a second UPS 202 coupled in parallel.

The specific components of the first UPS 102 will now be described in greater detail. The first UPS 102 is substantially the same as the second UPS 202 and like components are labeled using similar reference numbers, except that reference numbers for components of the first UPS start with the number one and reference numbers for components of the second UPS start with the number two.

The first UPS 102 is coupled to an external power source (not shown) via the mains bus 101. The first UPS 102 includes a phase input 104 coupled to a phase line 103 of the mains bus 101 and a neutral input 106 coupled to a neutral line 105 of the mains bus 101. Both the phase input 104 and the neutral input 106 are coupled to a Power Factor Correction (PFC) circuit 110 via a back-feed relay 108. The PFC circuit 110 is coupled to an inverter 112 via a split DC bus 114. The split DC bus 114 is coupled to a common neutral point 116 via capacitors C1 and C2. The inverter 112 has a neutral output 120 which is coupled to the neutral line 224 of a load bus 221 and a phase output 118 which is coupled to the phase line 222 of the load bus 221 via a relay 119. The load bus 221 is coupled to an external load (not shown). The phase input 104 is also coupled to the phase output 118 via a bypass line 126 and a relay 128. The neutral input 106 and the neutral output 120 are also coupled to ground 116. A battery 130 is coupled between the PFC 110 and the neutral point 116.

The first UPS 102 also includes a controller 132 which is coupled to the backfeed relay 108, the PFC 110, the inverter 112, the relays 128 and 119, and the neural 116. The controller 132 is also coupled to a wrong wiring detector 136. The wrong wiring detector 136 is coupled to an input Zero Crossing Detector (ZCD) 134 and an output ZCD 138. The input ZCD 135 is coupled to the phase input 104 and the neutral input 105. The output ZCD 138 is coupled to the phase output 118 and the neutral output 120. The wrong wiring detector 136 is also coupled to a transmission line 142 and a receive line 144.

The parallel UPS system 100 also includes a communication bus 140. According to some embodiments, the communication bus 140 is connected to each UPS 100 via a General Purpose Input/Output (GPIO), analog communication or any type of digital serial communication (e.g., such as CAN, RS232 and RS485). The communication bus is coupled to the transmission line 142, 242 and receive line 144, 244 of each UPS 102, 104.

During operation of UPS 101 and UPS 102, AC Power received by the mains line 101 from the external power source is provided to the phase input 104, 204 of each UPS 101, 202. When the feedback relay 108, 208 and the relay 119, 219 are closed, the PFC 110, 210 converts the AC power into DC power and provides the DC power to the split DC bus 114, 214. If AC power provided to the mains bus 101 is inadequate, the battery 130, 230 provides DC power to the split DC bus 114, 214. The inverter 112, 212 converts the DC power into regulated AC power and provides the regulated AC power to the phase line 222 via phase output 118, 218.

When the feedback relay 108, 208 and the relay 128, 228 are closed, the AC power from the phase input 104, 204 is provided directly to the phase output 118, 218 via the bypass line 126, 226, so that unregulated AC power is provided to the phase line 222. In addition, when the feedback relay 108, 208 is closed, the neutral input 106, 206 and the neutral output 120, 220 are coupled together to the common neutral point 116, 216.

The controller 132, 232 of each UPS 102, 202 controls the operation (i.e. which relays are closed) of each UPS 102, 202. According to some embodiments, the controller 132, 232 is an analog controller, a digital controller or both.

As discussed above, incorrect wiring of the inputs 104, 106, 204, 206 and/or the output 118, 120, 218, 220 may result in a short circuit in one or both of the UPS's 102, 202. Therefore, prior to closing the backfeed relay 108, 208 of each UPS 102, 202 (and activating the circuitry of each UPS 102, 202), an analysis of the input and output wiring of each UPS 102, 202 is first performed.

The input ZCD 134, 234 of each UPS 102, 202 monitors the zero crossings of the input voltage at the phase input 104, 204. The output ZCD 138, 238 of each UPS 102, 202 monitors the zero crossings of the output voltage at the phase output 118, 218. The zero-crossing information of each UPS is provided to the transmission line 142, 242 and is transmitted to the other UPS via the communications bus 140. The wrong wiring detector 136, 236 of each UPS 102, 202, receives, via the receive line 144, 244, the zero-crossing information of the other UPS. The wrong wiring detector 136, 236 compares the zero-crossing information of its own UPS with the received zero-crossing information from the other UPS. As the phase inputs 104, 204 and phase outputs 118, 218 are designed to be coupled to the same phase lines 103 and 222 respectively, the zero-crossing information from the first UPS 102 and the second UPS 202 should be in phase if the parallel UPS system is wired correctly. Hence, based on the comparison of its own UPS's zero-crossing information and the received zero-crossing information from the other UPS, the wrong wiring detector 136, 236 determines whether the input and output wiring of the parallel UPS system 100 is correct.

Figure 2A:
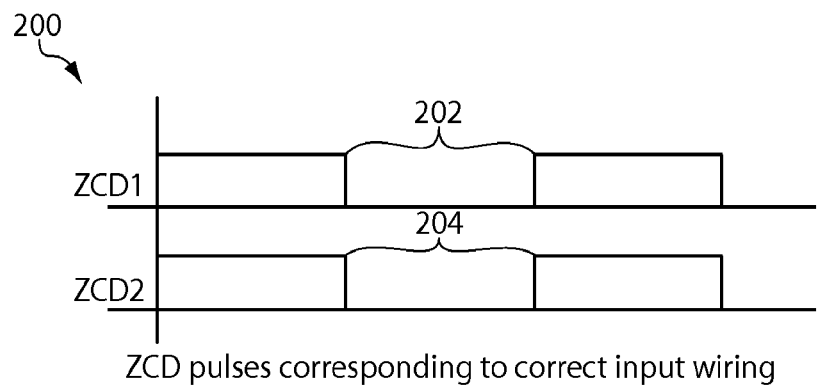
FIG. 2A is a graph illustrating zero-crossing detector pulses corresponding to correct input wiring in accordance with aspects of the present invention.

For example, FIG. 2A is a graph 200 illustrating input zero-crossing information received by the wrong wiring detector 136 of the first UPS 102 corresponding to correct input wiring. The graph 200 displays zero-crossing detection pulses 202 received from the input ZCD 134, and zero-crossing detection pulses 204 received from the second UPS 202 via the communication bus 140. As illustrated in FIG. 2A, the pulses 202, 204 are in phase, indicating that the wiring of the first UPS 102, and second UPS 202 is correct. After the wrong wiring detector 136 determines that wiring of the parallel UPS system 100 is correct, the controller 132 closes the backfeed relay 108 and the first UPS 102 begins providing power to the load bus 221. At the same time, the wrong wiring detector 236 of the second UPS 202 also determines that the wiring of the parallel UPS system 100 is accurate (based on zero-crossing information from its own UPS and from the first UPS 102) and the controller 232 closes the backfeed relay 208 so that the second UPS 202 also begins to provide power to the load bus 221.

Figure 2B:
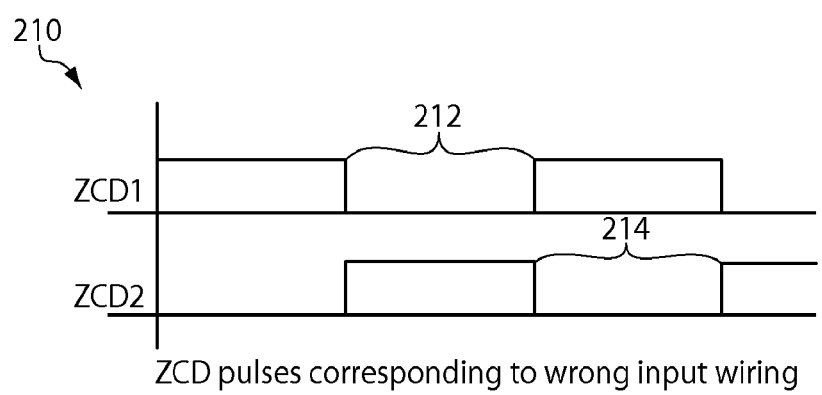
FIG. 2B is a graph illustrating zero-crossing detector pulses corresponding to incorrect input wiring in accordance with aspects of the present invention.

Alternatively, FIG. 2B is a graph 210 illustrating input zero-crossing information received by the wrong wiring detector 136 of the first UPS 102 corresponding to incorrect input wiring. The graph 210 displays zero-crossing detection pulses 212 received from the input ZCD 134, and zero-crossing detection pulses 214 received from the second UPS 202 via the communication bus 140. As illustrated in FIG. 2B, the pulses 212, 244 are out of phase, indicating that the wiring of the parallel UPS system 100 is incorrect. After the wrong wiring detector 136 determines that the wiring of the parallel UPS system 100 is incorrect, the backfeed relay 108 remains open to prevent a short circuit current from passing through the UPS 102 and a user is informed of the incorrect wiring (e.g., through a front panel display (not shown)). At the same time, the wrong wiring detector 236 of the second UPS 202 also determines that the wiring of the parallel UPS system 100 is incorrect (based on zero-crossing information from its own UPS and from the first UPS 102) and the backfeed relay 208 also remains open.

Figure 3:
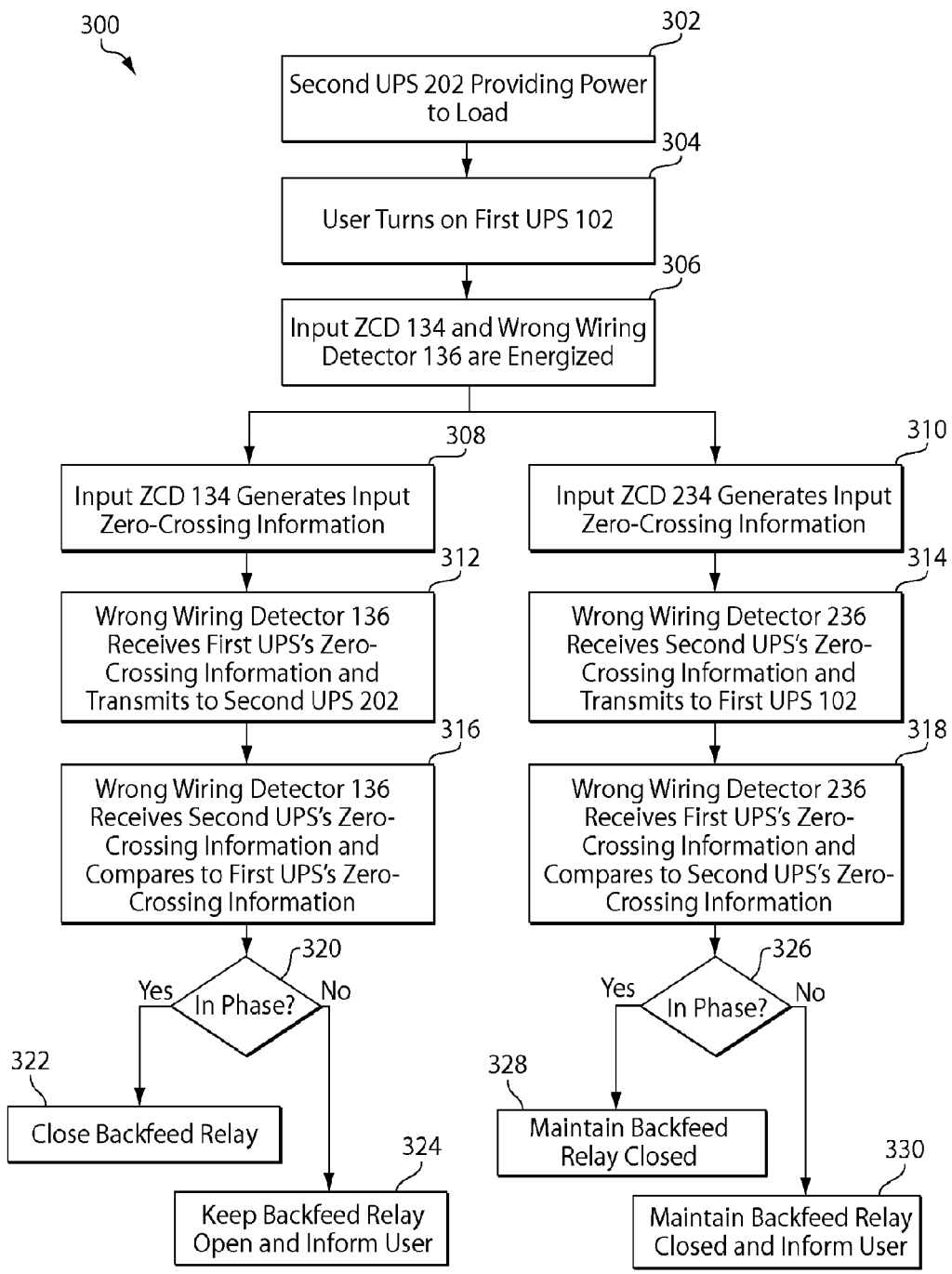
FIG. 3 is a flow chart illustrating a process for identifying incorrect input wiring in a parallel UPS system in accordance with aspects of the present invention.

FIG. 3 is a flow chart 300 illustrating one embodiment of a process for identifying incorrect input wiring in the parallel UPS system 100. At block 302, the second UPS 202 is providing power to a load via the load bus 221 while the first UPS 101 is off. The input ZCD 234 of the second UPS 202 is capable of generating zero-crossing information based on received power; however, the wrong wiring detector 236 cannot compare the zero-crossing information of the UPS 202 with other zero-crossing information as no other UPS is currently operating (i.e. no zero-crossing information is being transmitted to the UPS 202).

At block 304, a user turns on the first UPS 102. At block 306, the input ZCD 134 and the wrong wiring detector 136 of the first UPS 102 are energized. At block 308, the input ZCD 134 of the first UPS 102 generates input zero-crossing information based on the AC power received by the first UPS 102. At block 310, the input ZCD 234 of the second UPS 102 generates input zero-crossing information based on the AC power received by the second UPS 202.

At block 312, the wrong wiring detector 136 of the first UPS 102 receives input zero crossing information from its own UPS (i.e. from the input ZCD 134 of the first UPS 102) and transmits the input zero-crossing information to the wrong wiring detector 236 of the second UPS 202 via the communication bus 140. At block 314, the wrong wiring detector 236 of the second UPS 202 receives input zero crossing information from its own UPS (i.e. from the input ZCD 234 of the second UPS 202) and transmits the input zero-crossing information to the wrong wiring detector 136 of the first UPS 102 via the communication bus 140.

At block 316, the wrong wiring detector 136 of the first UPS 102 receives the input zero crossing information from the second UPS 202 and compares the received input zero crossing information with the zero-crossing information from the first UPS 102. At block 318, at substantially the same time as block 316, the wrong wiring detector 236 of the second UPS 202 receives the input zero crossing information from the first UPS 102 and compares the received input zero crossing information with the zero-crossing information from the second UPS 202.

At block 320, the wrong wiring detector 136 of the first UPS determines whether the zero-crossing information of the first UPS 102 is in phase with the zero-crossing information of the second UPS 202. At block 322, in response to a determination that the zero-crossing information is in phase, the controller 132 closes the backfeed relay 108, allowing the UPS 102 to provide power to the load bus 221. At block 324, in response to a determination that the zero-crossing information is out of phase, the controller 132 keeps the backfeed relay 108 open and informs the user of the wiring error.

At block 326, the wrong wiring detector 236 of the second UPS determines whether the zero-crossing information of the second UPS 202 is in phase with the zero-crossing information of the first UPS 102. At block 328, in response to a determination that the zero-crossing information is in phase, the controller 232 maintains the backfeed relay 208 closed, allowing the UPS 202 to continue to provide power to the load bus 221. At block 330, in response to a determination that the zero-crossing information is out of phase, the controller 232 still maintains the backfeed relay 208 closed in order to continue to provide power to the load bus 221 and informs the user of the wiring error.

As illustrated in FIG. 1, in addition to input ZCD's 134, 234 which are configured to monitor the zero crossings of signals at the phase input 104, 204 to identify faulty wiring at the inputs 104, 106, 204, 206, both UPS's 102, 202 also include an output ZCD 138, 238 which is configured to monitor the zero crossing of signals at the phase output 118, 218 in order to identify faulty wiring at the outputs 118, 120, 218, 220. According to one embodiment, the process of identifying faulty wiring at the outputs 118, 120, 218, 220 utilizing zero-crossing information is substantially the same as the process of identifying faulty wiring at the input 104, 105, 204, 206 utilizing zero-crossing information (as discussed above), except that the output ZCD's 138, 238 are utilized to generate the zero-crossing information rather than the input ZCD's 134, 234.

According to one embodiment, the controller 132, 232 is a Digital Signal Processor (DSP) (e.g., a microcontroller or Field Programmable Gate Array (FPGA)). The DSP 132, 232 may be configured to directly monitor the input and output voltage signals at the phase input 104, 204 and output 118, 218 respectively. For example, according to one embodiment, the DSP includes an Analog to Digital Converter channel coupled to the phase input 104, 204 and phase output 118, 218 and dedicated to input and output voltage monitoring. As a result, the ZCD circuits 134, 138, 234, 238 and wrong wiring detectors may not be necessary as the voltage monitoring and faulty wiring identification are performed directly by the DSP 132, 232. The DSP 132, 232 of each UPS 102, 202 is configured to communication with the DSP 132, 232 of the other UPS 102, 202 via the communication bus 140.

Around the peak (positive or negative) of the monitored input or output voltage, each DSP 132, 232 generates voltage polarity information of the input and output voltage signals and sends the polarity information to the other DSP 132, 232 via the communication bus 140. According to one embodiment, the polarity information is transmitted once or twice per line cycle; however, in other embodiments, the DSP 132, 232 is configured to transmit polarity information at any defined intervals. Each DSP 132, 232 compares the polarity information of its own UPS 102, 202 with the received polarity information from the other UPS 102, 202. As the phase inputs 104, 204 and phase outputs 118, 218 are designed to be coupled to the same phase lines 103 and 222 respectively, the polarity information of the first UPS 102 and the second UPS 202 should be in phase if wired correctly. Hence, based on the comparison of its own UPS's polarity information and the received polarity information from the other UPS, the DSP determines whether the input and output wiring of the parallel UPS system 100 is correct.

Figure 4A:
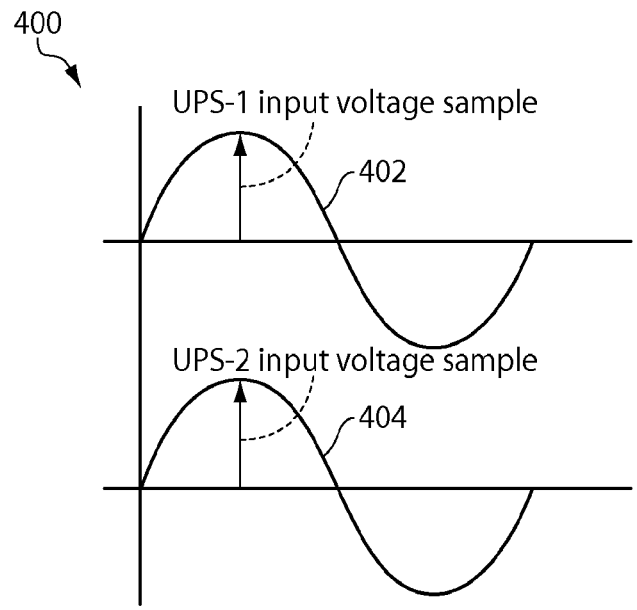
FIG. 4A is a graph illustrating input voltage samples corresponding to correct wiring in accordance with aspects of the present invention.

For example, FIG. 4A is a graph 400 illustrating input polarity information received by the DSP (i.e. controller) 132 of the first UPS 102 corresponding to correct input wiring. The graph 400 displays an input voltage sample 402 monitored by the DSP 132, and an input voltage sample 404 received from the DSP 232 of the second UPS 202 via the communication bus 140. As illustrated in FIG. 4A, the polarities of the input voltage samples 402, 404 are the same, indicating that the wiring of the first UPS 102, and second UPS 202 is correct. After the DSP 132 determines that wiring of the parallel UPS system 100 is correct, the DSP 132 closes the backfeed relay 108 and the first UPS 102 begins providing power to the load bus 221. At the same time, the DSP 232 of the second UPS 202 also determines that the wiring of the parallel UPS system 100 is accurate (based on polarity information from its own UPS and from the first UPS 102) and the DSP 232 closes the backfeed relay 208 so that the second UPS 202 also begins to provide power to the load bus 221.

Figure 4B:
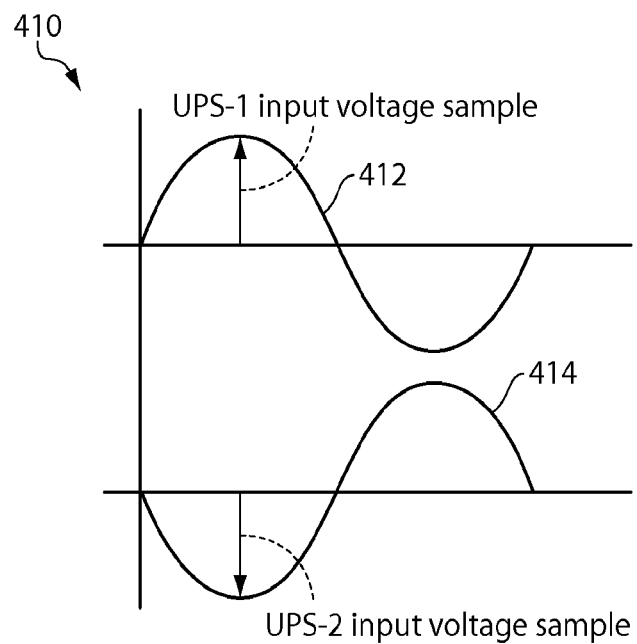
FIG. 4B is a graph illustrating input voltage samples corresponding to incorrect wiring in accordance with aspects of the present invention.

Alternatively, FIG. 4B is a graph 410 illustrating polarity information received by the DSP 132 of the first UPS 102 corresponding to incorrect input wiring. The graph 410 displays an input voltage sample 412 monitored by the DSP 132 and an input voltage sample 414 received from the second UPS 202 via the communication bus 140. As illustrated in FIG. 2B, the polarities of the input voltage samples 412, 414 are out of phase, indicating that the wiring of the parallel UPS system 100 is incorrect. After the DSP 132 determines that the wiring of the parallel UPS system 100 is incorrect, the backfeed relay 108 remains open to prevent a short circuit current from passing through the UPS 102 and a user is informed of the incorrect wiring (e.g., through a front panel display (not shown)). At the same time, the DSP 232 of the second UPS 202 also determines that the wiring of the parallel UPS system 100 is incorrect (based on polarity information from its own UPS and from the first UPS 102) and the backfeed relay 208 also remains open.

Figure 5:
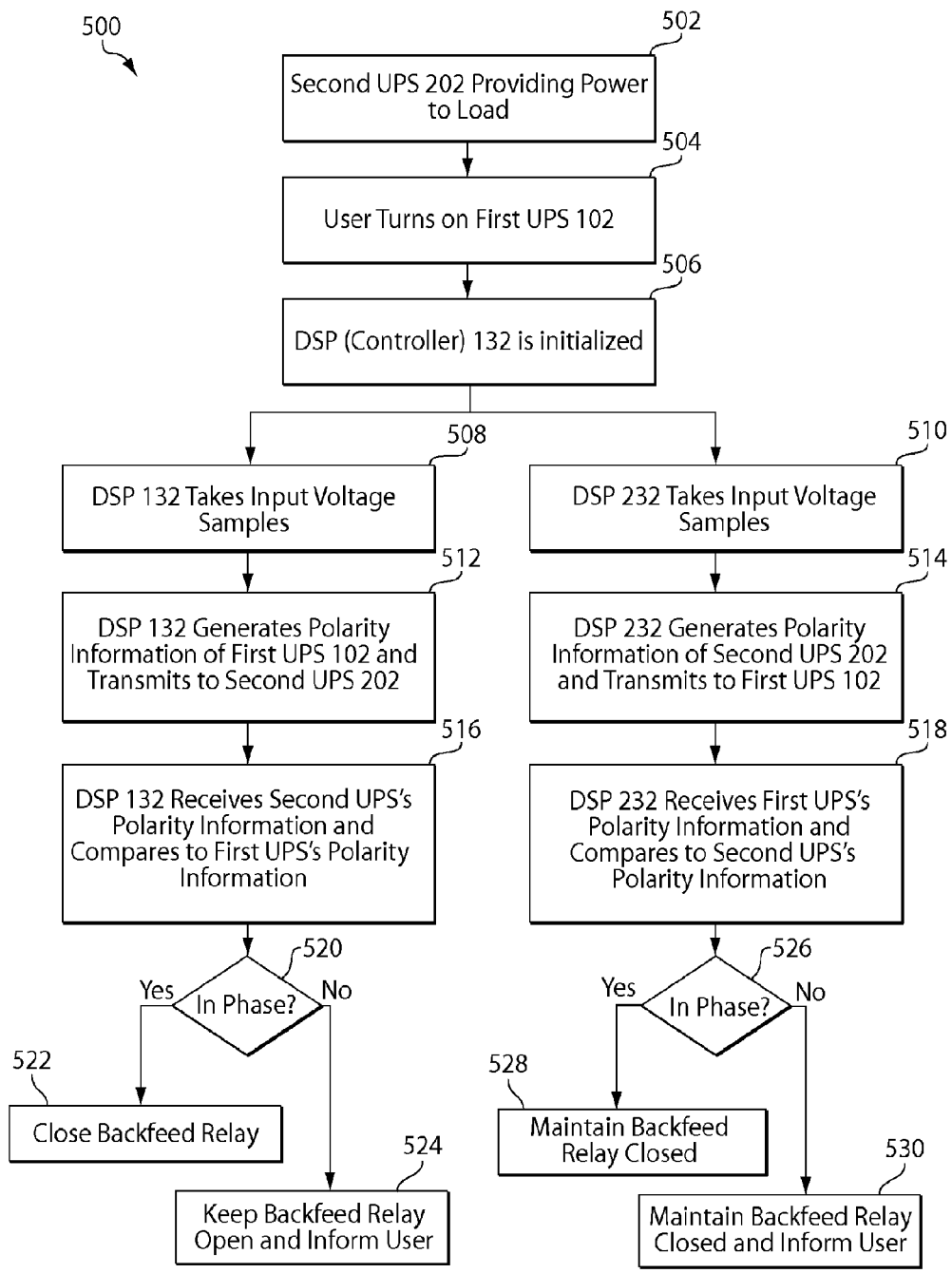
FIG. 5 is a flow chart illustrating a process for identifying incorrect input wiring in a parallel UPS system utilizing polarity information in accordance with aspects of the present invention.

FIG. 5 is a flow chart 500 illustrating another embodiment of a process for identifying incorrect input wiring in the parallel UPS system 100. At block 502, the second UPS 202 is providing power to a load via the load bus 221 while the first UPS 101 is off. The DSP 232 of the second UPS 202 is capable of generating polarity information based on received power; however, the DSP 232 cannot compare the polarity information of the UPS 202 with other polarity information as no other UPS is currently operating (i.e. no polarity information is being transmitted to the UPS 202).

At block 504, a user turns on the first UPS 102. At block 506, the DSP 132 of the first UPS 102 is energized. At block 508, the DSP 132 of the first UPS 102 takes input voltage samples of the AC power received by the first UPS 102. At block 510, the DSP 232 of the second UPS 102 takes input voltage samples of the AC power received by the second UPS 202.

At block 512, the DSP 132 of the first UPS 102 generates input polarity information and transmits the input polarity information to the DSP 232 of the second UPS 202 via the communication bus 140. At block 514, the DSP 232 of the second UPS 202 generates input polarity information and transmits the input polarity information to the DSP 132 of the first UPS 102 via the communication bus 140.

At block 516, the DSP 132 of the first UPS 102 receives the input polarity information from the second UPS 202 and compares the received input polarity information with the input polarity information from the first UPS 102. At block 518, at substantially the same time as block 516, the DSP 232 of the second UPS 202 receives the input polarity information from the first UPS 102 and compares the received input polarity information with the input polarity information from the second UPS 202.

At block 520, the DSP 132 of the first UPS 102 determines whether the input polarity information of the first UPS 102 is in phase with the input polarity information of the second UPS 202. At block 522, in response to a determination that the polarity information is in phase, the DSP 132 closes the backfeed relay 108, allowing the UPS 102 to provide power to the load bus 221. At block 524, in response to a determination that the input polarity information is out of phase, the DSP 132 keeps the backfeed relay 108 open and informs the user of the wiring error.

At block 526, the DSP 232 of the second UPS 202 determines whether the input polarity information of the second UPS 202 is in phase with the input polarity information of the first UPS 102. At block 528, in response to a determination that the input polarity information is in phase, the DSP 232 maintains the backfeed relay 208 closed, allowing the UPS 202 to continue to provide power to the load bus 221. At block 530, in response to a determination that the input polarity information is out of phase, the DSP 232 maintains the backfeed relay 208 closed in order to continue to provide power to the load bus 221 and informs the user of the wiring error.

As described above, in addition to monitoring the polarity of signals at the phase input 104, 204 to identify faulty wiring at the inputs 104, 106, 204, 206, the DSP's 132, 232 are also configured to monitor the polarity of signals at the phase output 118, 218 to identify faulty wiring at the outputs 118, 120, 218, 220. According to one embodiment, the process of identifying faulty wiring at the outputs 118, 120, 218, 220 utilizing polarity information is substantially the same as the process of identifying faulty wiring at the input 104, 106, 204, 206 utilizing polarity information (as described above), except that the voltage samples are taken from the outputs 118, 120, 218, 220 rather than the inputs 104, 106, 204, 206.

Figure 6:
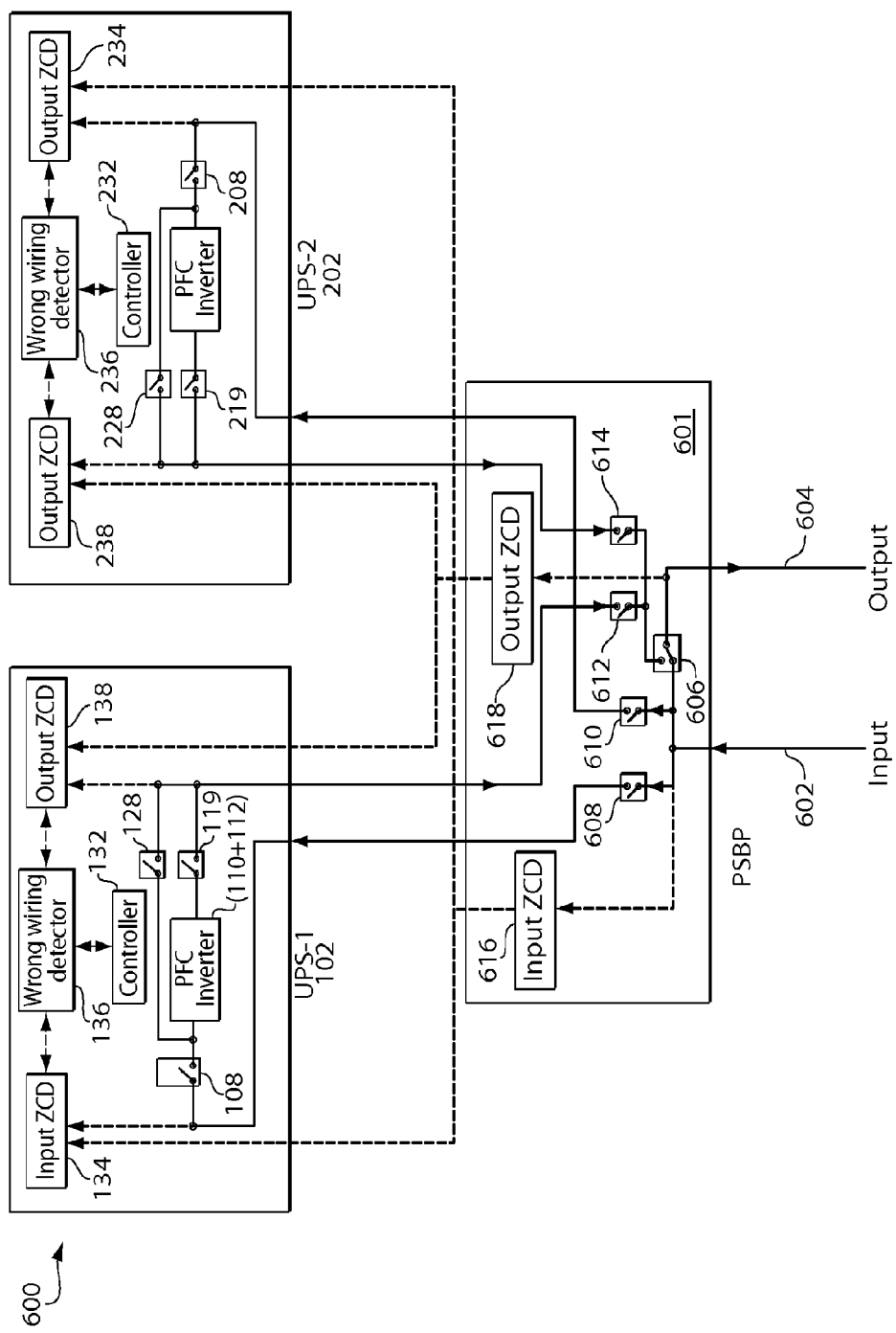
FIG. 6 is a block diagram of a parallel UPS system utilizing a PSBP in accordance with aspects of the present invention.

As described above, parallel UPS systems may utilize PSBP's to control the bypass operation of the parallel UPS system. FIG. 6 is a circuit diagram of a parallel UPS system 600 utilizing a PSBP in accordance with aspects of the present invention. The parallel UPS system 600 includes the first UPS 102 and the second UPS 202, as previously described. The input 602 of the parallel UPS system (and hence the input to each UPS 102, 202) and the output 604 of the parallel UPS system (to be provided to an external load) are both routed through a PSBP panel 601.

The PSBP panel 601 includes a service bypass switch 606 coupled between the input 602 and the output 604. The PSBP panel 601 also includes a plurality of circuit breakers/isolators. A first circuit breaker/isolator 608 is coupled between the input 602 and the backfeed relay 108 of the first UPS 102. A second circuit breaker/isolator 610 is coupled between the input 602 and the backfeed relay 208 of the second UPS 202. A third circuit breaker/isolator 612 is coupled between the service bypass switch 606 and the relays 129, 119. A fourth circuit breaker/isolator 614 is coupled between the service bypass switch 606 and the relays 228, 219.

The service bypass switch 606 controls whether the parallel UPS system 600 is operating in normal or bypass mode by selectively coupling the input 602 to the output 604 (i.e. bypass mode) or selectively coupling the output 604 to the third 612 and fourth 614 circuit breaker/isolators (i.e.

normal mode). Each of the plurality of circuit breaker/isolators can be operated to isolate each UPS 102, 202 in case of maintenance.

In addition, the PSBP panel 601 includes an input ZCD 616 and an output ZCD 618. The input ZCD 616 is coupled to the input 602 of the PSBP 601, the input ZCD 134 of the first UPS 102 and the input ZCD 234 of the second UPS 202. The output ZCD 618 is coupled to the output 604, the output ZCD 138 of the first UPS 102 and the output ZCD 238 of the second UPS 202.

The input and output ZCD's 616, 618 of the PSBP monitor zero-crossing information of signals received at the input 602 and output 604 of the PSBP respectively. This zero-crossing information is transmitted to both the first UPS 102 and the second UPS 202, via a GPIO or other form of serial communication. Prior to closing the backfeed relay 108, 208, each UPS 102, 202 performs input and output zero-crossing phase analysis (as described above) by comparing its own zero-crossing information (generated from the input ZCD's 134, 234 and the output ZCD's 138, 238) with the zero-crossing information received from the PSBP 601. In this way, each UPS can independently determine whether it is wired correctly, without having to receive signals from the other UPS.

Figure 7:
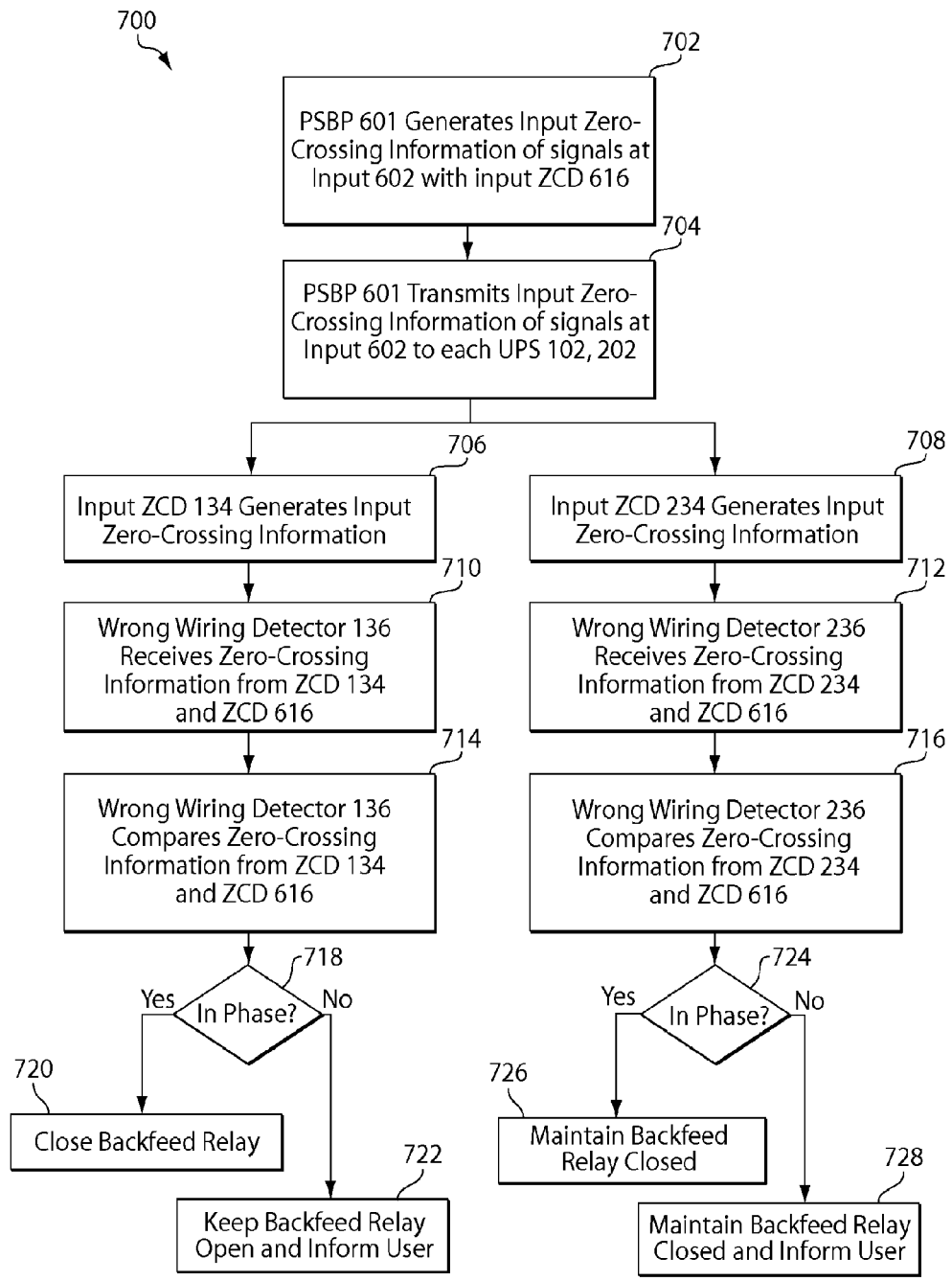
FIG. 7 is a flow chart illustrating a process for identifying incorrect input wiring in a parallel UPS system utilizing a PSBP in accordance with aspects of the present invention.

FIG. 7 is a flow chart 700 illustrating one embodiment of a process for identifying incorrect input wiring in the parallel UPS system 600 while the parallel UPS system 600 is operating in normal mode. At block 702, the PSBP panel 601 generates input zero-crossing information with the input ZCD 616, based on signals received at the input 602. At block 704, the PSBP panel 601 transmits the input zero-crossing information to each UPS 102, 202.

At block 706, the input ZCD 134 of the first UPS 102 generates input zero-crossing information based on the AC power received by the first UPS 102. At block 708, the input ZCD 234 of the second UPS 102 generates input zero-crossing information based on the AC power received by the second UPS 202.

At block 710, the wrong wiring detector 136 of the first UPS 102 receives input zero crossing information from its own UPS (i.e. from the input ZCD 134 of the first UPS 102) and from the input ZCD 616 of the PSBP panel 601. At block 712, the wrong wiring detector 236 of the second UPS 202 receives input zero crossing information from its own UPS (i.e. from the input ZCD 234 of the second UPS 202) and from the input ZCD 616 of the PSBP panel 601.

At block 714, the wrong wiring detector 136 of the first UPS 102 compares the received input zero crossing information from the ZCD 616 with the zero-crossing information from the first UPS 102. At block 716, at substantially the same time as block 714, the wrong wiring detector 236 of the second UPS 202 compares the received input zero crossing information from the ZCD 616 with the zero-crossing information from the second UPS 202.

At block 718, the wrong wiring detector 136 of the first UPS determines whether the zero-crossing information of the first UPS 102 is in phase with the zero-crossing information from the PSBO 601. At block 720, assuming the first UPS 102 is not currently providing power to a load and in response to a determination that the zero-crossing information is in phase, the controller 132 closes the backfeed relay 108, allowing the UPS 102 to provide power to the load bus 221. At block 722, assuming the first UPS 102 is not currently providing power to a load and in response to a determination that the zero-crossing information is out of phase, the controller 132 keeps the backfeed relay 108 open and informs the user of the wiring error.

At block 724, the wrong wiring detector 236 of the second UPS determines whether the zero-crossing information of the second UPS 202 is in phase with the zero-crossing information from the PSBP 601. At block 726, assuming the second UPS 202 is currently providing power to a load and in response to a determination that the zero-crossing information is in phase, the controller 232 maintains the backfeed relay 208 closed, allowing the UPS 202 to continue to provide power to the load bus 221. At block 728, assuming the second UPS 202 is currently providing power to a load and in response to a determination that the zero-crossing information is out of phase, the controller 232 still maintains the backfeed relay 208 closed in order to continue to provide power to the load bus 221 and informs the user of the wiring error.

As illustrated in FIG. 6, in addition to an input ZCD 616 which is configured to monitor zero-crossing information of signals at the input 602 and transmit the zero-crossing information to each UPS 102, 202 in order to identify faulty wiring at the inputs 104, 106, 204, 206, the PSBP panel also includes an output ZCD 618 which is configured to monitor zero-crossing information of signals at the output 604 and transmit the zero-crossing information to each UPS 102, 202 in order to identify faulty wiring at the outputs 118, 120, 218, 220. According to one embodiment, the process of identifying faulty wiring at the outputs 118, 120, 218, 220 utilizing zero-crossing information from the PSBP 601 is substantially the same as the process of identifying faulty wiring at the input 104, 105, 204, 206 utilizing zero-crossing information from the PSBP 601 (as discussed above), except that the output ZCD 618 is utilized to generate the zero-crossing information from the PSBP rather than the input ZCD 616.

As discussed herein, each UPS 102, 202 is coupled to a single phase power supply and accompanying phase and neutral lines 103, 105, 222, 224; however, in other embodiments, each UPS 102, 202 may be coupled to a different type of power supply (e.g., a three phase power supply) and may include an appropriate number of phase lines.

As also discussed herein, each UPS 102, 202 includes both an input ZCD 134, 234 and an output ZCD 138, 238; however, in other embodiments, a UPS may include only one ZCD to monitor the wiring of either the input or the output. Similarly, as described herein, the PSBP panel 601 includes both an input ZCD 616 and an output ZCD 618; however, in other embodiments, the PSBP 601 may include only one ZCD for monitoring the wiring of either the input or the output.

As described herein, the controller 132, 232 may be a DSP; however, in other embodiments, the DSP may be separate from the controller 132, 232. For example, in one embodiment, each UPS 102, 202 includes both an analog controller 132, 232 and a DSP, where the analog controller 132, 232 is configured to operate the UPS 102, 202 and the DSP is configured to analyze input and output signals (as discussed above).

Also as described herein, the parallel UPS system 100, 500 includes two UPS's; however, in other embodiments, a parallel UPS system may include any number of UPS's.

Further, as described herein, the scheme for identifying incorrect wiring is utilized within a parallel UPS system; however, in other embodiments, the scheme may be utilized in other types of power supply systems where multiple systems are coupled in parallel.

As described herein, a parallel UPS system utilizes signal analysis circuitry (e.g., the ZCD's, wrong wiring detector and/or DSP) to analyze input and output signal characteristics (such as zero-crossing and polarity information) of UPS's coupled in parallel to identify incorrect wiring in the parallel UPS system, prior to energizing each UPS within the system. By identifying incorrect wiring in a parallel UPS system prior to a short circuit situation arising, the need to interrupt power to a critical load may be reduced and a short circuit may be prevented from being fed to the UPS units.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a UPS system having a first UPS, the method comprising:
   receiving, at an input of the first UPS, input power from a power source;
   generating, with a first analysis circuit within the first UPS, a first signal containing information indicative of a signal characteristic of the input power received by the first UPS;
   receiving, at the first analysis circuit, a second signal from a second analysis circuit of a device coupled to the power source, the second signal containing information indicative of a signal characteristic of input power received by the device;
   analyzing, with the first analysis circuit, the first signal from the first analysis circuit of the first UPS and the second signal from the second analysis circuit of the device;
   determining, in response to analyzing the first signal and the second signal, whether an improper wiring condition exists at the input of the first UPS;
   in response to a determination, based on the analysis of the first signal and the second signal, that an improper wiring condition does not exist at the input, providing output power to an output of the first UPS; and
   in response to a determination, based on the analysis of the first signal and the second signal, that an improper wiring condition does exist at the input, de-energizing the first UPS.

2. The method of claim 1, wherein generating a first signal includes:
   monitoring zero-crossing information of the input power received by the first UPS; and
   generating the first signal containing zero-crossing information of the input power received by the first UPS.

3. The method of claim 2, wherein analyzing includes comparing the first signal containing zero-crossing information with the second signal, the second signal containing zero-crossing information of the input power received by the device.

4. The method of claim 1, wherein generating a first signal includes:
   monitoring polarity information of the input power received by the first UPS; and
   generating the first signal containing polarity information of the input power received by the first UPS.

5. The method of claim 4, wherein analyzing includes comparing the first signal containing polarity information with the second signal, the second signal containing polarity information of the input power received by the device.

6. The method of claim 1, wherein receiving the second signal includes receiving the second signal from the second analysis circuit via a communication bus coupled between the first UPS and the second analysis circuit.

7. The method of claim 6, further comprising transmitting the first signal to the second analysis circuit via the communication bus.

8. The method of claim 6, wherein receiving the second signal further includes receiving the second signal from the device, wherein the device is a second UPS coupled to the power source.

9. The method of claim 6, wherein receiving the second signal further includes receiving the second signal from the second analysis circuit, wherein the second analysis circuit is within a PSBP panel coupled to the power source.

10. The method of claim 1, wherein de-energizing the first UPS includes de-coupling the first UPS from the power source.

11. The method of claim 1, further comprising:
    detecting, at an output of the first UPS, output power provided to a load;
    generating, with the first analysis circuit, a third signal containing information indicative of a signal characteristic of the output power detected at the output of the first UPS;
    receiving, at the first analysis circuit, a fourth signal from a second UPS, the fourth signal containing information indicative of a signal characteristic of output power detected at an output of the second UPS;
    analyzing, with the first analysis circuit, the third signal and the fourth signal;
    determining, in response to analyzing, whether an improper wiring condition exists at the output of the first UPS;
    in response to a determination that an improper wiring condition does not exist at the output, providing output power to the output of the first UPS; and
    in response to a determination that an improper wiring condition does exist at the output, de-energizing the first UPS.

12. A UPS comprising:
    an input to receive input power from a power source;
    an output to provide output power to a load;
    a first analysis circuit coupled to the input and configured to be coupled to a communication bus; and
    control circuitry coupled to the first analysis circuit;
    wherein the first analysis circuit is configured to generate a first signal containing information indicative of a signal characteristic of the input power at the input, receive via the communication bus a second signal from a second analysis circuit of a device coupled to the power source, the second signal containing information indicative of a signal characteristic of input power received by the device, analyze the first signal from the first analysis circuit of the UPS and the second signal from the second analysis circuit of the device, and determine, based on the first and second signal analysis, whether an improper wiring condition exists at the input,
    wherein, in response to a determination, based on the analysis of the first signal and the second signal, that an improper wiring condition does not exist at the input, the control circuitry is configured to operate the UPS to provide output power to the output, and
    wherein, in response to a determination, based on the analysis of the first signal and the second signal, that an improper wiring condition does exist at the input, the control circuitry is configured to de-energize the UPS.

13. The UPS of claim 12, further comprising a relay coupled to the input and the control circuitry, wherein in response to a determination by the first analysis circuit that the first and second signals are in phase, the control circuitry is configured to close the relay, allowing that the UPS to provide output power to the output, and wherein, in response to a determination by the first analysis circuit that the first and second signals are out of phase, the control circuitry is configured to open the relay to de-energize the UPS.

14. The UPS of claim 12, wherein the first analysis circuit is further coupled to the output and is further configured to generate a third signal containing information indicative of a signal characteristic of the output power at the output, receive via the communication bus a fourth signal from the second analysis circuit, the fourth signal containing information indicative of a signal characteristic of output power at a second UPS containing the second analysis circuit, analyze the third signal and the fourth signal, and determine, based on the third and fourth signal analysis, whether an improper wiring condition exists at the output,
- wherein, in response to a determination that an improper wiring condition does not exist at the output, the control circuitry is configured to close the relay so that the UPS provides output power to the output, and
- wherein, in response to a determination that an improper wiring condition does exist at the output, the control circuitry is configured to open the relay to de-energize the UPS.

15. The UPS of claim 12, wherein the first analysis circuit comprises:
- a first zero-crossing detector coupled to the input; and
- a wrong wiring detector coupled to the zero-crossing detector, the control circuitry and the communication bus,
- wherein the first zero-crossing detector is configured to monitor zero-crossing information of input power received at the input and generate the first signal, the first signal containing zero-crossing information of the input power received at the input, and
- wherein the wrong wiring detector is configured to compare the first signal containing zero-crossing information with the second signal, the second signal containing zero-crossing information of the input power received by the device.

16. The UPS of claim 15, wherein the wrong wiring detector is further configured to receive the second signal containing zero-crossing information from a second zero-crossing detector within a second UPS coupled to the power source.

17. The UPS of claim 15, wherein the wrong wiring detector is further configured to receive the second signal containing zero-crossing information from a second zero-crossing detector within a PSBP coupled to the power source.

18. The UPS of claim 12, wherein the first analysis circuit comprises:
- a first DSP coupled to the input,
- wherein the DSP is configured to monitor polarity information of input power received at the input, generate the first signal containing polarity information of the input power received at the input, and compare the first signal containing polarity information with the second signal, the second signal containing polarity information of the input power received by the device.

19. The UPS of claim 17, wherein the first DSP is further configured to receive the second signal containing polarity information from a second DSP within a second UPS coupled to the power source.

20. A parallel UPS system, the system comprising:
a plurality of UPS's coupled in parallel, each UPS including:
- at least one phase input coupled to a power source via a mains bus;
- a neutral input coupled to the power source via the mains bus;
- at least one phase output coupled to a load via a load bus;
- a neutral output coupled to the load via the load bus; and
- means for identifying incorrect wiring of the at least one phase input and the neutral input to the mains bus and the at least one phase output and the neutral output to the load bus.

* * * * *